(12) United States Patent
Nejad et al.

(10) Patent No.: US 7,932,173 B2
(45) Date of Patent: *Apr. 26, 2011

(54) METHOD OF FABRICATING INTEGRATED CIRCUITRY

(75) Inventors: Hasan Nejad, Boise, ID (US); James E. Green, Caldwell, ID (US)

(73) Assignee: Micron Technology, Inc., Boise, ID (US)

( * ) Notice: Subject to any disclaimer, the term of this patent is extended or adjusted under 35 U.S.C. 154(b) by 204 days.

This patent is subject to a terminal disclaimer.

(21) Appl. No.: 12/121,258

(22) Filed: May 15, 2008

(65) Prior Publication Data

US 2008/0227289 A1    Sep. 18, 2008

Related U.S. Application Data

(60) Division of application No. 11/209,025, filed on Aug. 22, 2005, now Pat. No. 7,387,959, which is a continuation of application No. 10/402,471, filed on Mar. 28, 2003, now Pat. No. 6,933,224.

(51) Int. Cl.
  *H01L 21/00* (2006.01)
(52) U.S. Cl. .............. 438/622; 438/637; 438/706
(58) Field of Classification Search ................ 438/622, 438/637, 706
  See application file for complete search history.

(56) References Cited

U.S. PATENT DOCUMENTS

| | | | |
|---|---|---|---|
| 4,840,923 A | 6/1989 | Flagello et al. | |
| 5,895,264 A | 4/1999 | Teo | |
| 5,939,336 A | 8/1999 | Yates | |
| 6,012,469 A | 1/2000 | Li et al. | |
| 6,090,721 A | 7/2000 | Yates | |
| 6,117,351 A | 9/2000 | Li et al. | |
| 6,126,853 A | 10/2000 | Kaufman et al. | |
| 6,133,144 A | 10/2000 | Tsai et al. | |
| 6,192,899 B1 | 2/2001 | Li et al. | |
| 6,316,370 B1 | 11/2001 | Mercaldi et al. | |
| 6,350,322 B1 | 2/2002 | Yates | |
| 6,358,793 B1 | 3/2002 | Yates et al. | |
| 6,444,583 B2 | 9/2002 | Oaki | |
| 6,453,914 B2 | 9/2002 | Torek et al. | |
| 6,486,108 B1 | 11/2002 | Yates et al. | |
| 6,497,827 B1 | 12/2002 | Li et al. | |
| 6,517,738 B1 | 2/2003 | Torek et al. | |
| 6,539,963 B1 | 4/2003 | Dunn | |
| 6,562,719 B2 | 5/2003 | Kondo et al. | |
| 6,562,726 B1 | 5/2003 | Torek et al. | |
| 6,573,554 B2 | 6/2003 | Yates et al. | |
| 6,601,595 B2 | 8/2003 | Yates | |
| 6,607,001 B1 | 8/2003 | Yates | |
| 6,620,216 B2 | 9/2003 | Oshima et al. | |

(Continued)

OTHER PUBLICATIONS

Archer et al., "Removing postash polymer residue from BEOL structures inorganic chemicals", Reprinted from MICRO, 6 pgs , Canon Communications, Jun. 2001.

*Primary Examiner* — Laura M Menz
(74) *Attorney, Agent, or Firm* — Wells St. John P.S.

(57) ABSTRACT

The invention includes methods of fabricating integrated circuitry. In one implementation, at least two different elevation conductive metal lines are formed relative to a substrate. Then, interconnecting vias are formed in a common masking step between, a) respective of the at least two different elevation conductive metal lines, and b) respective conductive nodes. Interconnecting conductive metal is provided within the interconnecting vias. Other aspects and implementations are contemplated.

10 Claims, 8 Drawing Sheets

U.S. PATENT DOCUMENTS

| | | |
|---|---|---|
| 6,627,001 B2 | 9/2003 | Chen |
| 6,635,515 B2 | 10/2003 | Okuaki |
| 6,639,266 B1 | 10/2003 | Yates |
| 6,641,677 B1 | 11/2003 | Yates |
| 6,645,311 B2 | 11/2003 | Yates |
| 6,656,289 B2 | 12/2003 | Yates |
| 6,656,372 B2 | 12/2003 | Yates |
| 6,673,675 B2 | 1/2004 | Yates et al. |
| 6,703,319 B1 | 3/2004 | Yates et al. |
| 6,740,248 B2 | 5/2004 | Li et al. |
| 6,743,641 B2 | 6/2004 | Yates et al. |
| 6,750,128 B2 | 6/2004 | Kondo et al. |
| 6,762,132 B1 | 7/2004 | Yates |
| 6,783,695 B1 | 8/2004 | Torek et al. |
| 6,794,704 B2 | 9/2004 | Yates et al. |
| 6,830,627 B1 | 12/2004 | Covert et al. |
| 6,933,224 B2 * | 8/2005 | Nejad et al. .................... 438/622 |
| 7,387,959 B2 * | 6/2008 | Nejad et al. .................... 438/622 |
| 2002/0139387 A1 | 10/2002 | Yates |
| 2002/0165105 A1 | 11/2002 | Yates et al. |
| 2002/0165106 A1 | 11/2002 | Yates et al. |
| 2002/0165107 A1 | 11/2002 | Yates et al. |
| 2002/0169089 A1 | 11/2002 | Yates et al. |
| 2002/0173156 A1 | 11/2002 | Yates et al. |
| 2002/0187906 A1 | 12/2002 | Yates et al. |
| 2003/0003754 A1 | 1/2003 | Yokoi et al. |
| 2003/0148624 A1 | 8/2003 | Ikemoto et al. |
| 2004/0029392 A1 | 2/2004 | Morgan |
| 2004/0043610 A1 | 3/2004 | Yates |
| 2004/0192028 A1 * | 9/2004 | Nejad et al. .................... 438/637 |
| 2006/0030144 A1 * | 2/2006 | Nejad et al. .................... 438/622 |
| 2008/0227289 A1 * | 9/2008 | Nejad et al. .................... 438/622 |

* cited by examiner

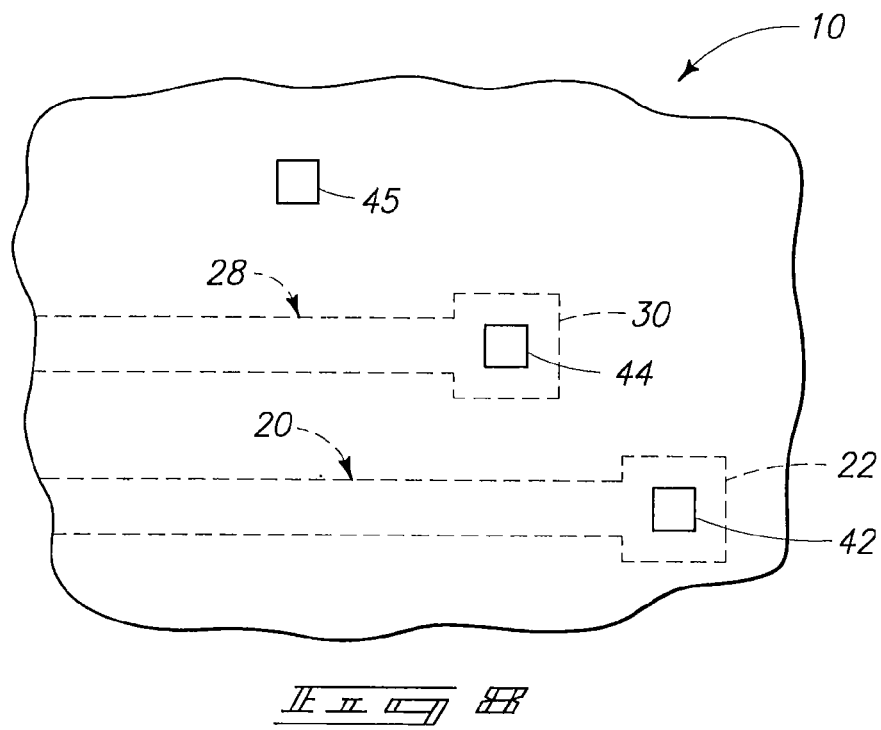
_FIG. 8_
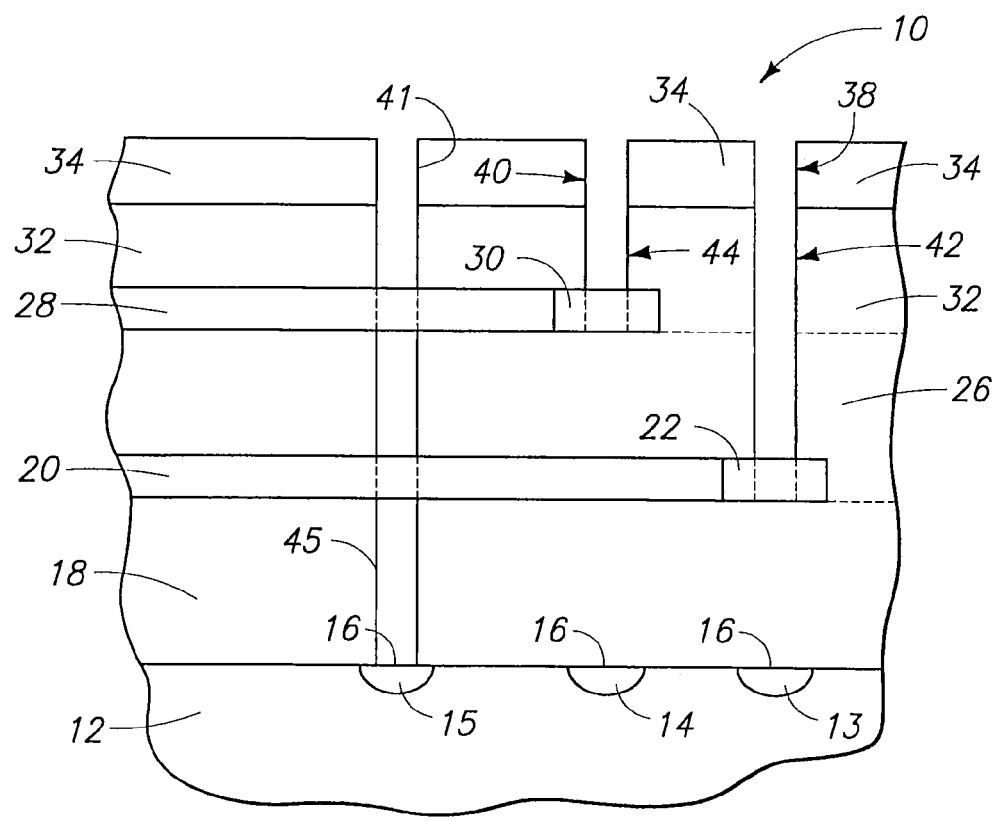
_FIG. 9_

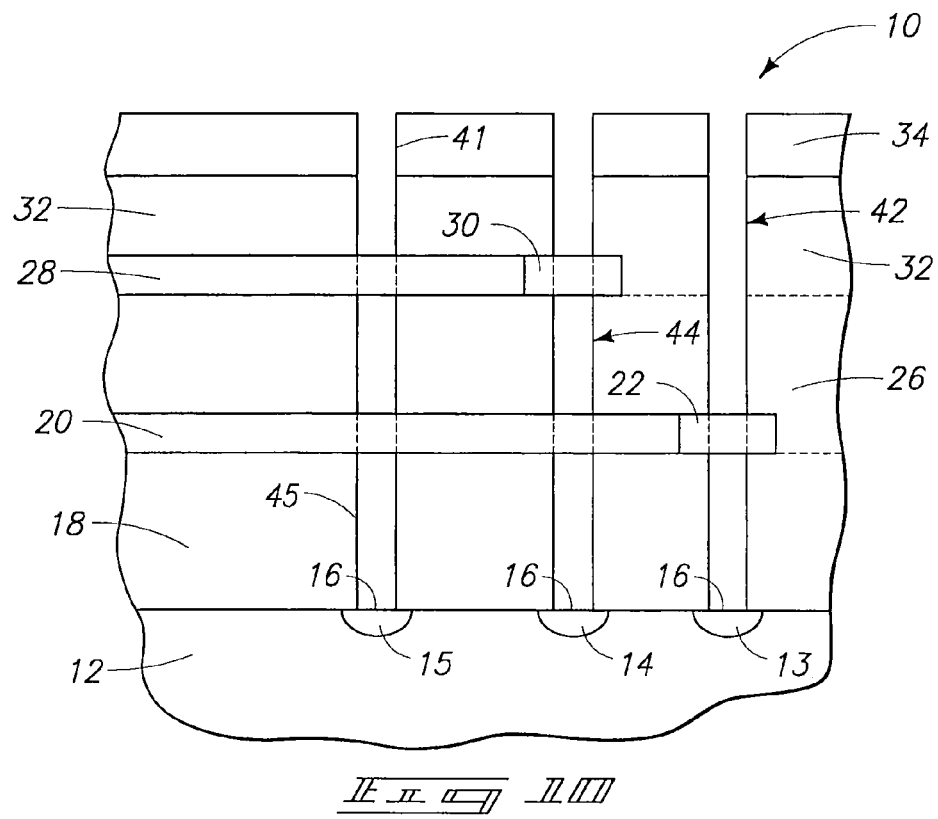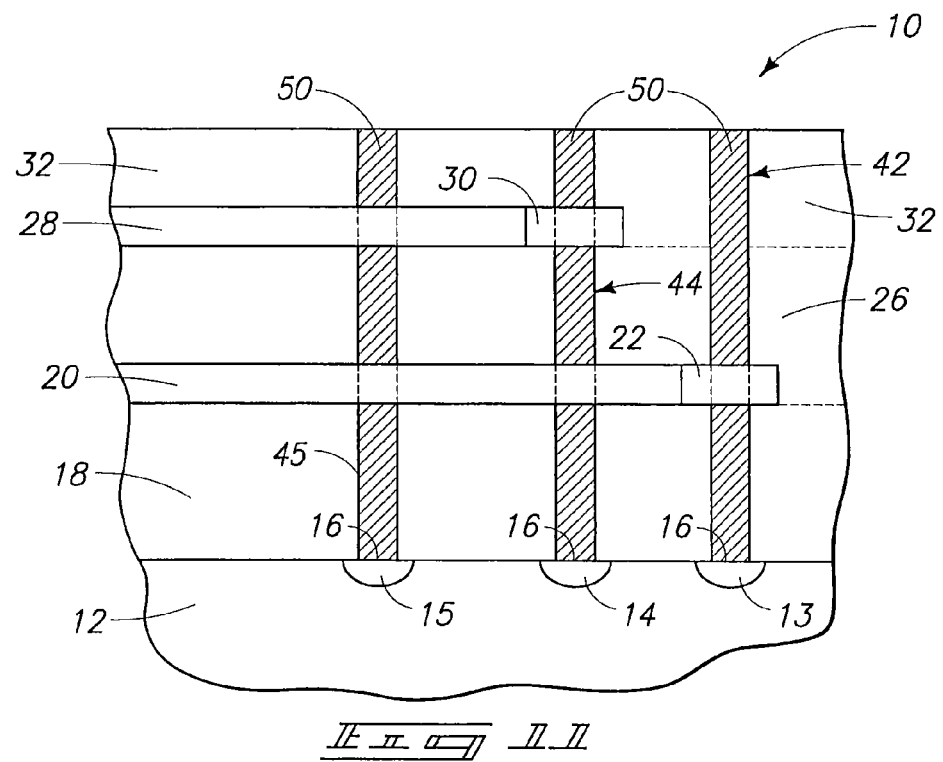

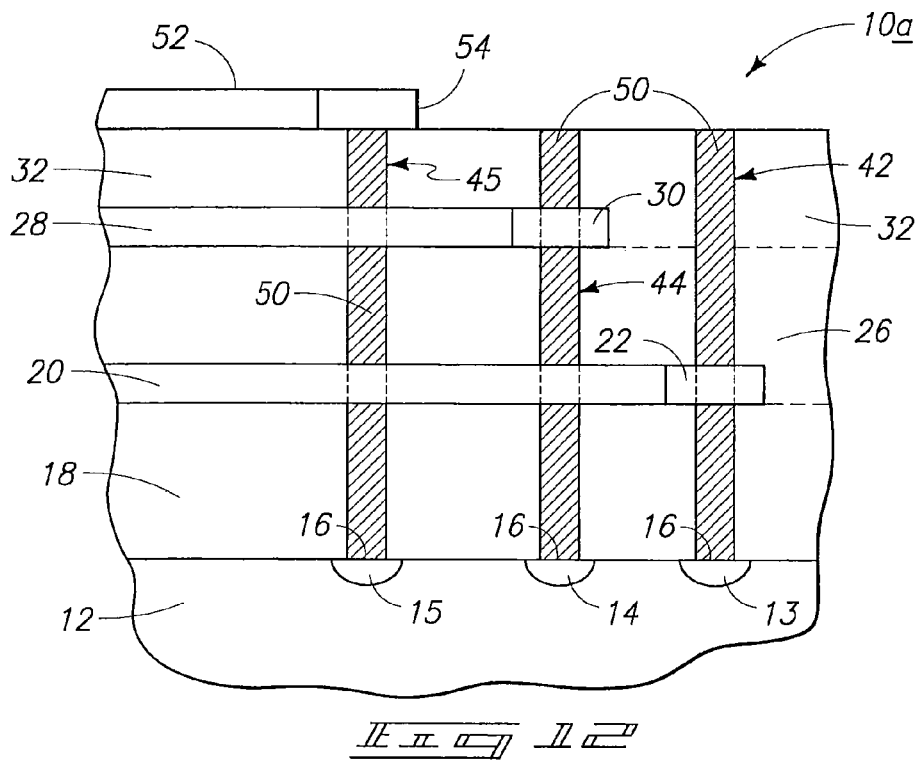
_FIG. 12_
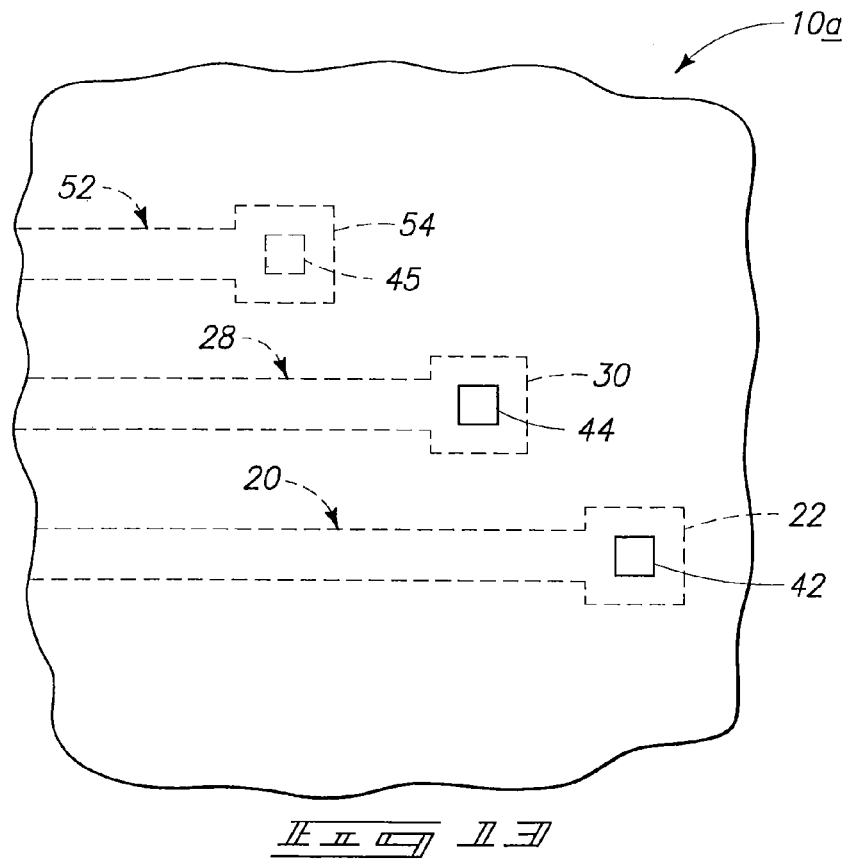
_FIG. 13_

METHOD OF FABRICATING INTEGRATED CIRCUITRY

RELATED PATENT DATA

This patent resulted from a divisional application of U.S. patent application Ser. No. 11/209,025, filed Aug. 22, 2005, now U.S. Pat. No. 7,387,959 entitled "Method of Fabricating Integrated Circuitry", naming Hasan Nejad and James E. Green as inventors, which resulted from a continuation application of U.S. patent application Ser. No. 10/402,471, filed Mar. 28, 2003, entitled "Method of Fabricating Integrated Circuitry", naming Hasan Nejad and James E. Green as inventors, now U.S. Pat. No. 6,933,224, the disclosures of which are incorporated by reference.

TECHNICAL FIELD

This invention relates to methods of fabricating integrated circuitry.

BACKGROUND OF THE INVENTION

Conductive metal lines at different elevations are typically formed in the fabrication of integrated circuitry. Each of these metal lines typically is connected to circuitry elevationally lower in the substrate by fabrication of via/contact openings into and through interlevel dielectric layers to different conductive nodes therebeneath. Accordingly, separate masks are typically utilized to fabricate the contact opening pattern for each elevation or level at which different metal lines are formed.

Semiconductor processing in the fabrication of integrated circuitry strives to reduce the number of processing steps a wafer is subjected to, and especially the number of masking steps. This can reduce the overall cost of manufacturing and as well reduces risk in damaging of the wafer by reducing the opportunity for damage.

While the invention was motivated in addressing the above issues and improving upon the above-described drawbacks, it is in no way so limited. The invention is only limited by the accompanying claims as literally worded (without interpretative or other limiting reference to the above background art description, remaining portions of the specification, or the drawings), and in accordance with the doctrine of equivalents.

SUMMARY

The invention includes methods of fabricating integrated circuitry. In one implementation, at least two different elevation conductive metal lines are formed relative to a substrate. Then, interconnecting vias are formed in a common masking step between, a) respective of the at least two different elevation conductive metal lines, and b) respective conductive nodes. Interconnecting conductive metal is provided within the interconnecting vias.

In one implementation, a method of fabricating integrated circuitry includes forming first and second conductive nodes on a substrate. A first conductive line is formed over the first conductive node. The first conductive node and the first conductive line have a first interlevel dielectric therebetween. A second conductive line is formed over the first conductive line. The first and second conductive lines have a second interlevel dielectric therebetween. After forming the first and second conductive metal lines and in a common masking step, first and second openings are etched into and through the first and second interlevel dielectrics. The first opening forms a first via connecting the second conductive line with the first node. The second opening forms a second via connecting the second conductive line with the second conductive node. Interconnecting conductive material is provided within the first and second vias.

In one implementation, a method of fabricating integrated circuitry comprises forming at least two conductive metal lines over a semiconductor substrate at different elevations. All interlevel dielectric material that is to be fabricated over the semiconductor substrate that will be received elevationally between all metal lines is provided on the substrate. After forming the at least two metal lines, interconnecting vias are formed in a common masking step between, a) respective of said at least two conductive metal lines at different elevations, and b) respective conductive nodes. Interconnecting conductive material is provided within the interconnecting vias. There is no fabrication of any interconnecting vias between any conductive line and any conductive node lower than any conductive line after said common masking step.

Other aspects and implementations are contemplated.

BRIEF DESCRIPTION OF THE DRAWINGS

Preferred embodiments of the invention are described below with reference to the following accompanying drawings.

FIG. 8 is a top view of FIG. 7.

FIG. 9 is a view of the FIG. 7 substrate fragment at a processing point subsequent to that depicted by FIG. 7.

FIG. 10 is a view of the FIG. 9 substrate fragment at a processing point subsequent to that depicted by FIG. 9.

FIG. 11 is a view of the FIG. 10 substrate fragment at a processing point subsequent to that depicted by FIG. 10.

FIG. 12 is a diagrammatic side elevational view of an alternate embodiment semiconductor substrate fragment at one processing point in accordance with an aspect of the invention.

FIG. 13 is a top view of FIG. 12.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
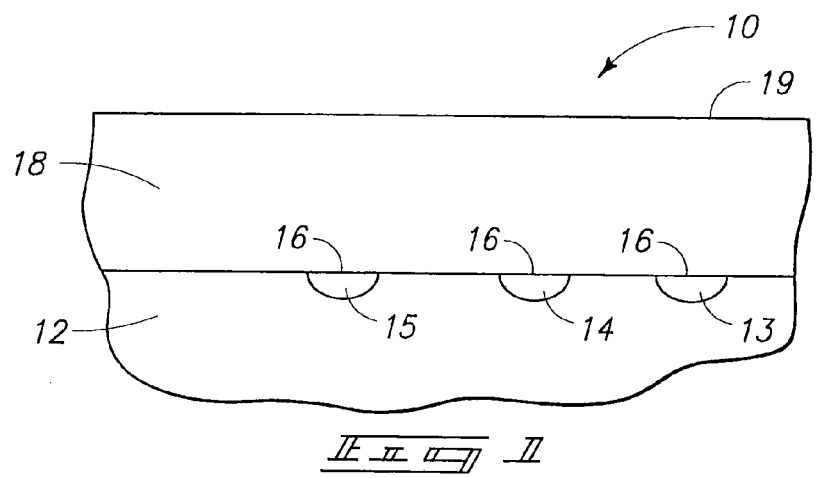
FIG. 1 is a diagrammatic side-like elevational view of a semiconductor substrate fragment at one processing point in accordance with an aspect of the invention.

Referring initially to FIG. 1, a substrate is indicated generally with reference numeral 10. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Further in the context of this document, the term "layer" encompasses both the singular and the plural unless otherwise indicated.

Substrate 10 is preferably a semiconductor substrate, for example comprised of a bulk monocrystalline substrate 12. Exemplary first, second and third diffusion regions 13, 14, 15, respectively, are formed within semiconductive material 12. By way of example only, such constitute respective first, second and third conductive nodes formed on a substrate and to which conductive vias/interconnects will be formed. In one exemplary preferred embodiment and as shown, the subject conductive nodes constitute multiple, discrete and thereby different nodes. As but one exemplary alternate embodiment, such nodes might constitute a single, common node, for example a single diffusion region, conductive line or other component or device. Further by way of example in the illustrated exemplary embodiment, the conductive nodes have respective outer surfaces 16 which are received at a common elevation relative to substrate 10, and to which the interconnecting vias/contacts will be formed. A first interlevel dielectric 18 is formed over conductive nodes 13, 14 and 15. Such might be comprised of one or more materials, with one preferred material being borophosphosilicate glass (BPSG). Further preferably and typically, such layer is effectively provided to have a planarized outer surface 19. An exemplary thickness for layer 18 is 200 nanometers.

Figure 2:
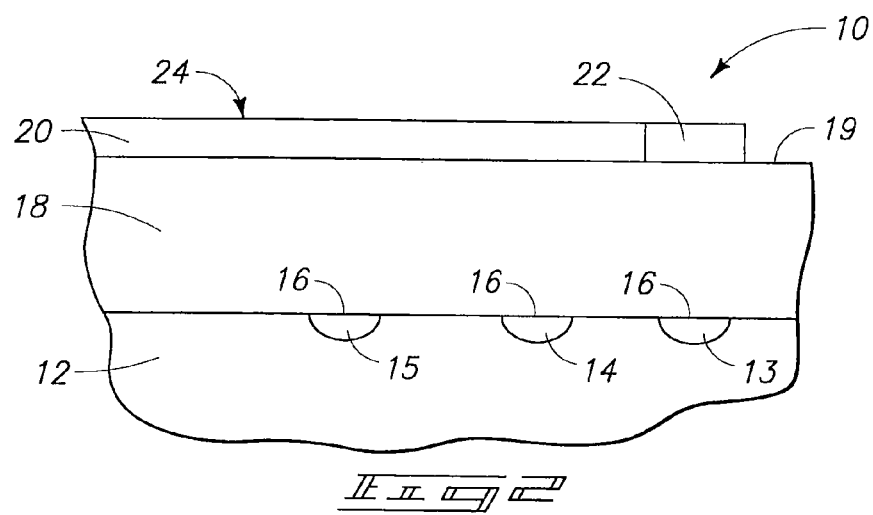
FIG. 2 is a view of the FIG. 1 substrate fragment at a processing point subsequent to that depicted by FIG. 1.
Figure 3:
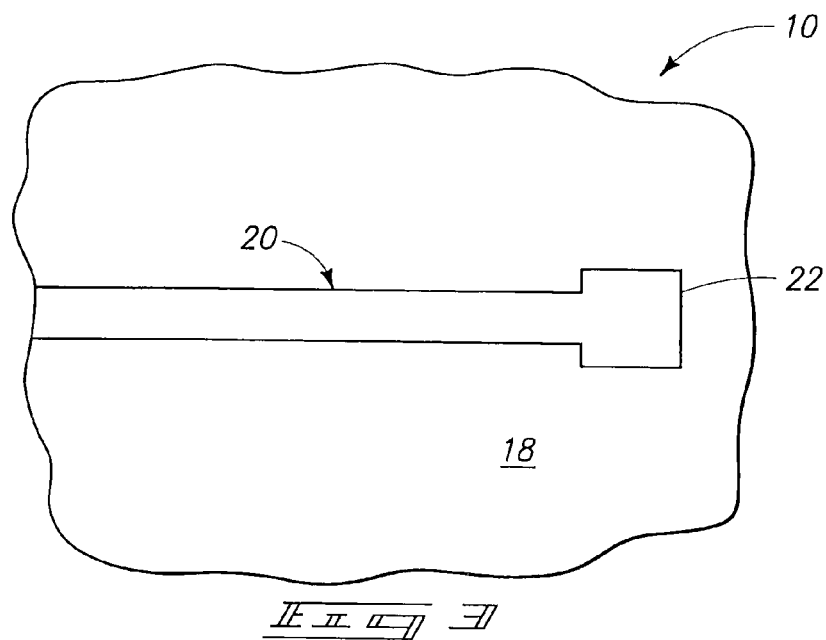
FIG. 3 is a top view of FIG. 2.

Referring to FIGS. 2 and 3, a first conductive line 20 is formed over at least first conductive node 13, with first interlevel dielectric 18 being received between such conductive line and conductive node. Most preferably, line 20 constitutes a metal line. In the context of this document, a "metal line" is defined as a conductive conduit/interconnect having a length greater than its maximum width and thickness and which at least a majority of it along its length consists essentially of "metal". In the context of this document, "metal" is defined to mean any one or combination of an elemental metal, an alloy of at least two elemental metals, and a conductive metal compound. In one preferred embodiment, all portions of conductive line 20 are formed to consist essentially of at least one of elemental metal, metal alloy and conductive metal compound. In the illustrated preferred embodiment, conductive metal line 20 includes a laterally enlarged portion 22 which by definition is thereby greater in width along a portion of at least one side of the conductive line. An exemplary preferred material for conductive line 20 is an aluminum-copper alloy. An exemplary thickness is 400 nanometers. Line 20 might be formed by subtractive etching, a damascene trench and fill technique, or other technique whether existing or yet-to-be-developed. Further in the illustrated preferred embodiment, line 20 is fabricated such that it has an outermost surface 24 which is globally planar across the substrate.

Figure 4:
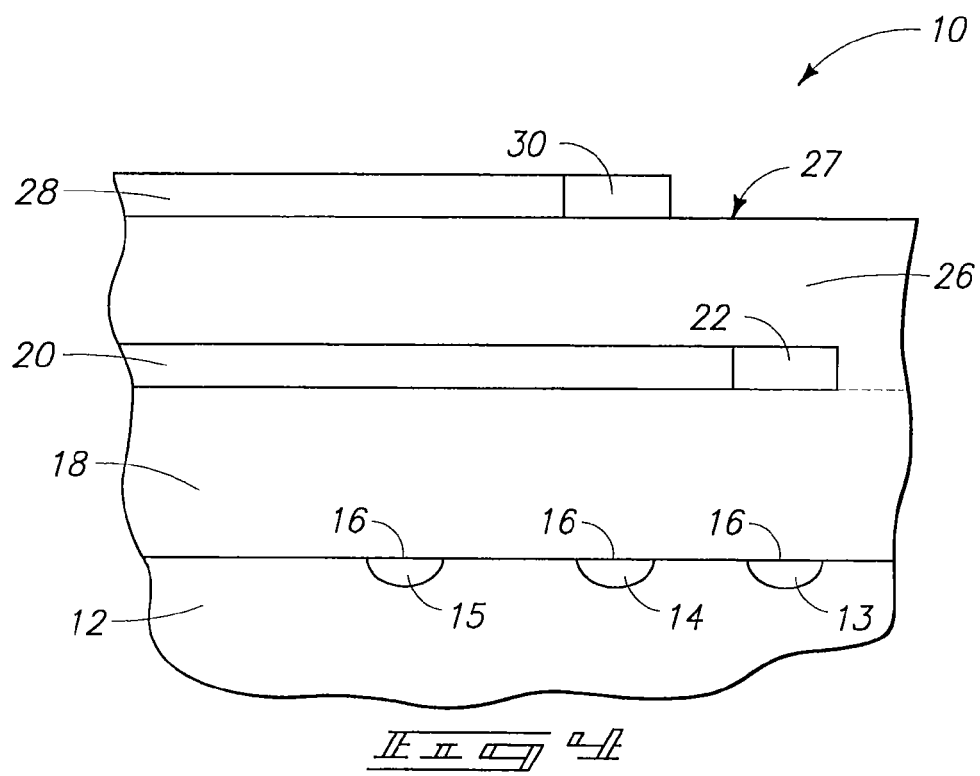
FIG. 4 is a view of the FIG. 2 substrate fragment at a processing point subsequent to that depicted by FIG. 2.
Figure 5:
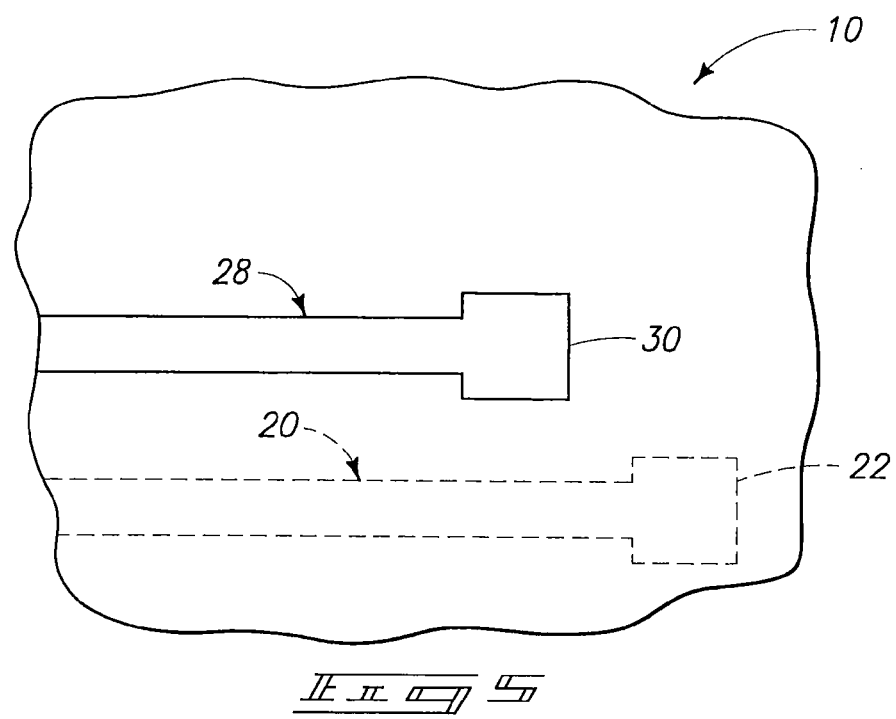
FIG. 5 is a top view of FIG. 4.

Referring to FIGS. 4 and 5, a second interlevel dielectric 26 is formed over conductive line 20. Exemplary preferred material is the same material utilized for the first interlevel dielectric, and an exemplary thickness is 20 nanometers. Accordingly and yet, the first and second interlevel dielectrics might be of the same/common composition, or be of one or more different compositions. Second interlevel dielectric 26 is also preferably provided to have a globally planar outermost surface 27. A second conductive line 28 is formed over second interlevel dielectric 26. Such might be of the same/common composition as metal line 20, or be of one or more different compositions. Second conductive line 28 in the illustrated preferred embodiment has a laterally enlarged portion 30 received over second conductive node 14.

Figure 6:
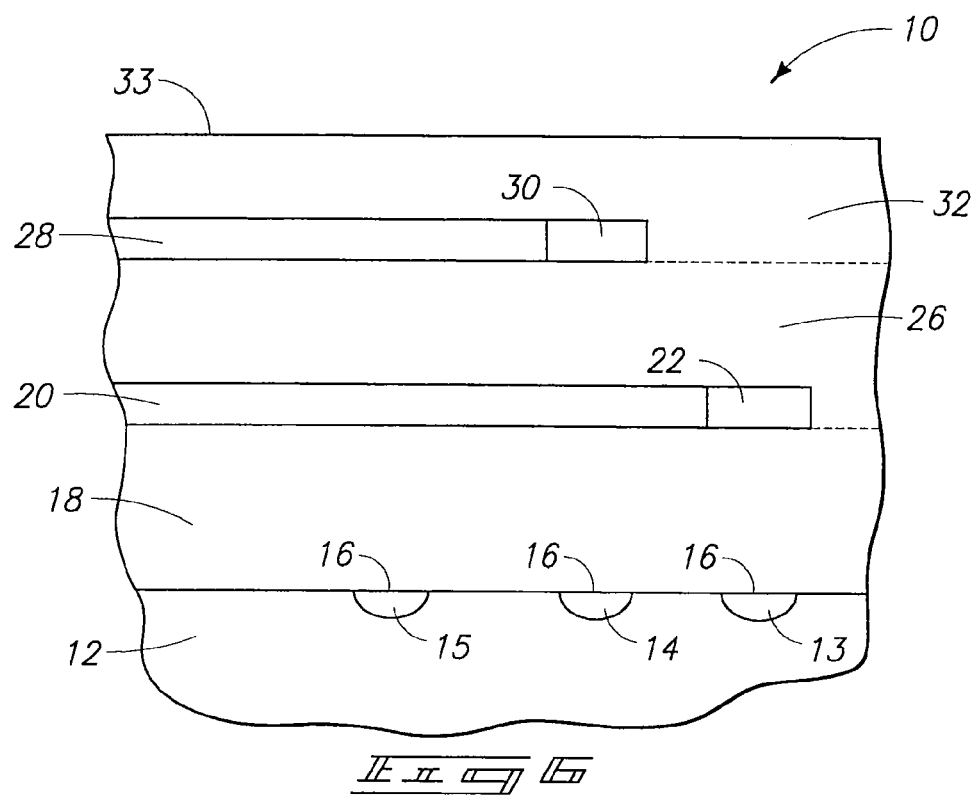
FIG. 6 is a view of the FIG. 4 substrate fragment at a processing point subsequent to that depicted by FIG. 4.

Referring to FIG. 6, a third interlevel dielectric 32 is formed over second line 28. Such can be of the same/common composition with either of the first and second interlevel dielectrics or consist partially/wholly of a different composition. Such is preferably provided to have a planar outer surface 33, as shown. In one preferred embodiment, any/all interlevel dielectric material that is to be received elevationally between all metal lines would be fabricated onto the substrate prior to the via formation as described below.

Figure 7:
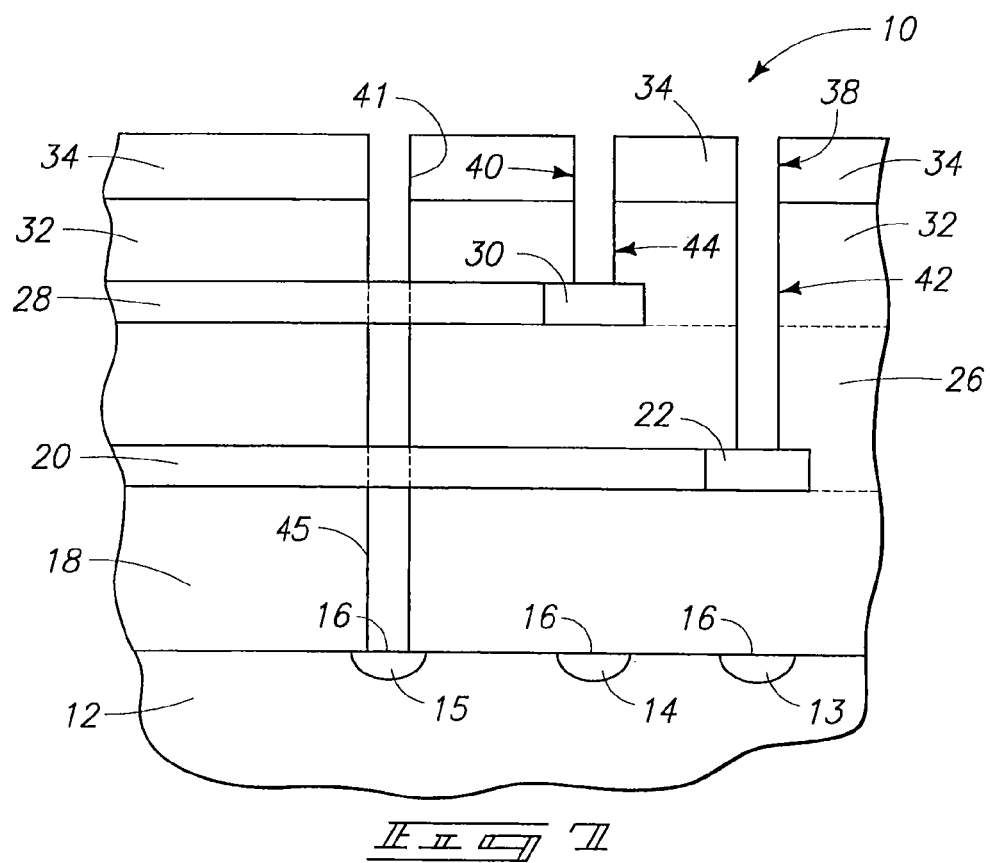
FIG. 7 is a view of the FIG. 6 substrate fragment at a processing point subsequent to that depicted by FIG. 6.

Referring to FIGS. 7 and 8, a masking layer 34 (for example photoresist) is formed over third interlevel dielectric 32, with mask openings 38, 40, and 41 being formed therethrough. A first opening 42 is then etched into and through third interlevel dielectric 32 and second interlevel dielectric 26 to expose laterally enlarged portion 22 of first conductive line 20. A second opening 44 is etched into and through third dielectric 32 to expose laterally enlarged portion 30 of second conductive metal line 28. Another opening 45 is etched into and through third dielectric 32 to expose outer surface 16 of conductive node 15. In one considered aspect, openings 41 and 45 might not be fabricated, for example if only two metal line layers were being fabricated on the substrate. Openings 42, 44 and 45 are etched using a common masking step, for example utilizing the illustrated preferred photoresist having mask openings 38, 40, and 41 formed therein. Most preferably, the etching to form openings 42, 44 and 45 occurs at least partially simultaneously. Where, for example, the exemplary third and second dielectrics are of the same or similar composition, the preferred illustrated etching can be conducted utilizing some suitable single, first chemistry as selectable by the artisan, and whether existing or yet-to-be-developed, to produce the illustrated FIGS. 7 and 8 construction.

Referring to FIG. 9 and utilizing the exemplary FIG. 7 common masking step, the exposed laterally enlarged portions of the first and second conductive metal lines are etched through. Such might utilize the same chemistry utilized in FIG. 7, but would typically more likely use a second chemistry different from the first chemistry, and which would typically be substantially selective relative to the dielectric material(s). Such chemistries are known and selectable by the artisan, with any existing or yet-to-be-developed chemistries of course being utilizable. In the illustrated preferred embodiment, such etching extends first opening 42 into and through first metal line 20 to expose first interlevel dielectric 18, with second opening 44 being extended into and through second conductive line 28 to expose second interlevel dielectric 26.

Referring to FIG. 10, and again using the preferred common masking step of FIG. 7, etching is continued to extend first opening 42 through first interlevel dielectric 18 to outer surface 16 of first conductive node 13, and to extend opening 44 through second interlevel dielectric 26 and first interlevel dielectric 18 to outer surface 16 of second conductive node 14. Such might be conducted using the first chemistry, the second chemistry or a different chemistry whether existing or yet-to-be-developed as selected by the artisan.

Referring to FIG. 11, masking material 34 has been removed. Interconnecting conductive material 50 has been provided within the extended first and second openings (and within opening 45) effective to electrically connect first conductive line 20 with first conductive node 13 and second conductive line 28 with second conductive node 14. Exemplary materials include at least one of metal and conductively doped semiconductive material.

FIGS. 12 and 13 illustrate a preferred exemplary alternate embodiment or additional processing with respect to a substrate 10*a*. Such depict an exemplary third conductive line 52 formed over third interlevel dielectric 32. In the illustrated preferred embodiment, such includes a laterally enlarged portion 54. Third via/opening 45 has been formed therethrough, as well as through the exemplary first, second and third dielectrics to outer surface 16 of third conductive node 15, and subsequently filled with interconnecting conductive material 50. Again in but one preferred embodiment, any/all interlevel dielectric material that is to be received elevationally between all metal lines would be fabricated onto the substrate prior to the via formation. Accordingly in but one aspect of such preferred embodiment, there is no fabrication of any interconnecting vias between any conductive line and any conductive node lower than any conductive line after the common masking step.

The above processings, by way of example only, constitute but exemplary embodiments of a method of fabricating integrated circuitry in accordance with an aspect of the invention whereby at least two different elevation conductive metal lines are formed. After forming such lines, interconnecting vias are formed in a common masking step between, a) respective of the at least two different elevation conductive metal lines, and b) respective conductive nodes. Interconnecting conductive material is provided within those interconnecting vias. In one implementation, such preferred embodiment employs interlevel dielectric which is etched to form the vias using at least two different chemistries. Processing, materials and/or constructions might be provided wherein exemplary interconnecting vias formed through interlevel dielectric material and/or through the conductive metal lines might be formed using only a single etching chemistry, with but one exemplary further example being described below.

The above described exemplary embodiments also constitute but exemplary methods of fabricating integrated circuitry comprising the formation of first and second conductive nodes (i.e., 13 and 14) on a substrate. A first conductive line is formed over the first conductive node, with a first interlevel dielectric (i.e., material 18) being received between the first conductive node and the first conductive line. A second conductive line is formed over the first conductive line with a second interlevel dielectric (i.e., material 26) being received between the first and second conductive lines. Thereafter, and in a common masking step, first and second openings (i.e., openings 42 and 44) are etched into and through the first and second interlevel dielectrics, with the first opening forming a first via connecting the second conductive line with the first node and the second opening forming a second via connecting the second conductive line with the second conductive node. Interconnecting conductive material is provided within the first and second vias.

Figure 14:
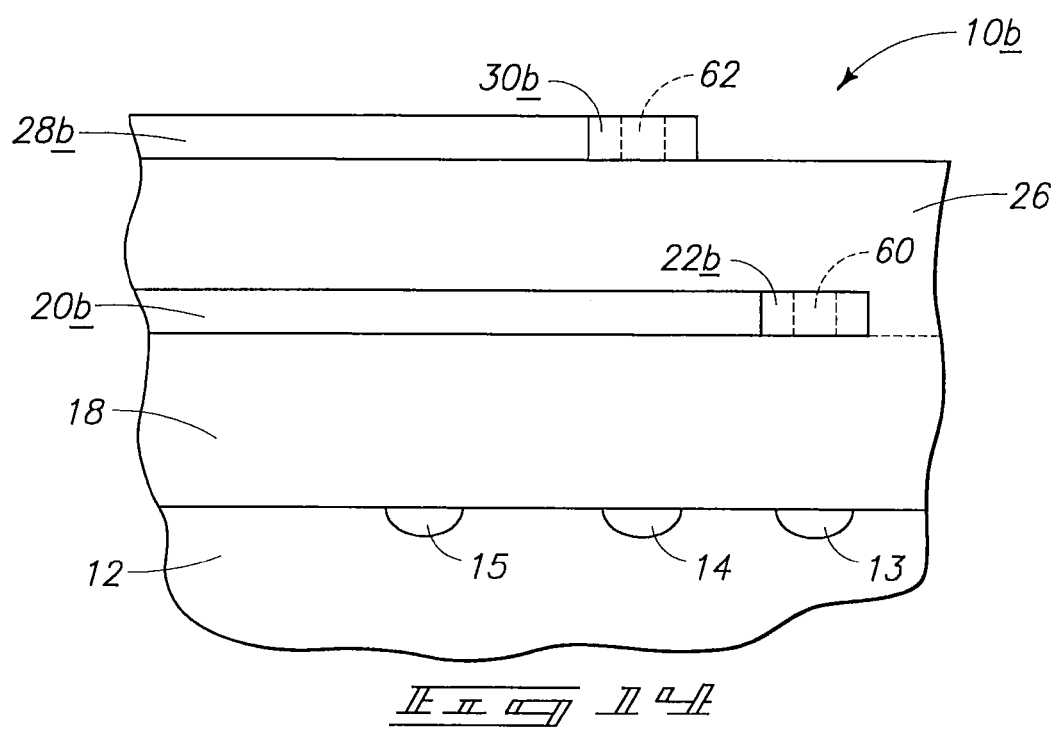
FIG. 14 is a diagrammatic side elevational view of another alternate embodiment semiconductor substrate fragment at one processing point in accordance with an aspect of the invention.
Figure 15:
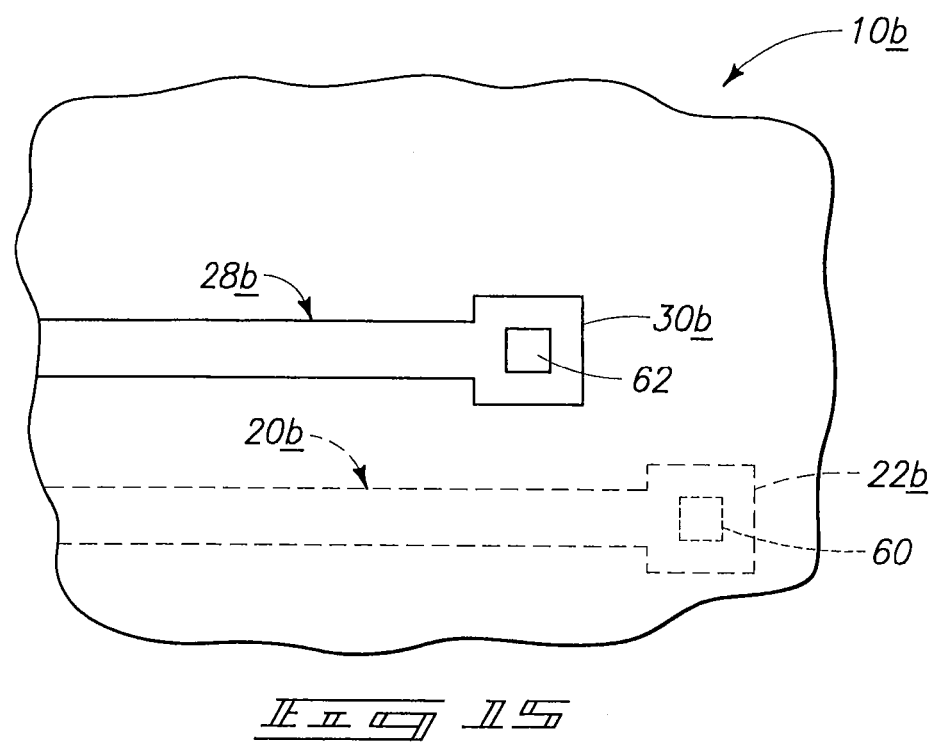
FIG. 15 is a top view of FIG. 14.

The above exemplary preferred embodiments also describe etching processing whereby etching to form the respective via opening etches into material of the first and second conductive lines. By way of example only, one exemplary alternate embodiment is hereby described whereby the first and second metal lines may or may not be etched into. Specifically, FIGS. 14 and 15 depict an exemplary alternate substrate 10*b*. Like numerals from the first described embodiment are utilized where appropriate, with differences being indicated with the suffix "b" or with different numerals. Specifically, laterally enlarged portion 22*b* of first conductive metal line 20*b* has some first dielectric material 60 extending therethrough over first conductive node 13. Laterally enlarged portion 30*b* of second conductive metal line 28*b* has second dielectric material 62 extending therethrough and over second conductive node 14. Materials 60 and 62 might be the same as one another, common to any of first and second dielectrics 18 and 26, and might of course be different in composition.

Figure 16:
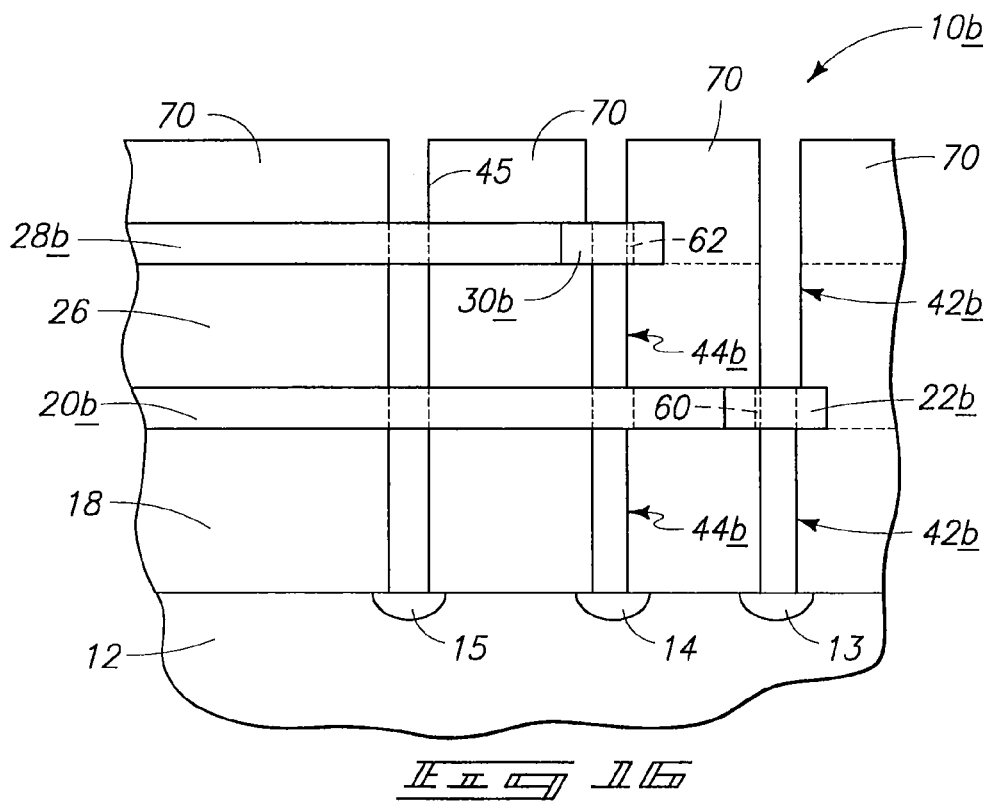
FIG. 16 is a view of the FIG. 14 substrate fragment at a processing point subsequent to that depicted by FIG. 14.

Referring to FIG. 16, an exemplary masking/dielectric layer 70 is formed over the substrate of FIGS. 14 and 15. An exemplary preferred material is silicon dioxide, for example BPSG, which has been patterned (preferably using photolithography and etch) to form openings 42*b*, 44*b* and 45. Openings 42*b* and 44*b* are shown to be slightly misaligned relative to the dielectric material received within the enlarged portions of lines 28*b* and 20*b*, as may occur slightly in production processing. Openings 42*b*, 44*b*, and 45 are preferably formed utilizing a common masking step, for example using photoresist as exemplified in the first described embodiment. Etching that might be used to form openings 42*b*, 44*b* and 45 might occur in one preferred embodiment utilizing only a single chemistry for etching all of materials 60, 62, 70, 26 and 18. Further by way of example, such etching might be conducted using a single or multiple chemistries whereby the etching is substantially selective relative to the material of lines 20*b* and 28*b* such that such materials are not appreciably etched into. Alternately by way of example only, the depicted FIG. 16 etching might be conducted purposefully or otherwise to etch into internal side portions of the first and second conductive metal lines within which material 60 and 62 are received, and perhaps thereby enlarge the openings formed therethrough. Further in the illustrated exemplary FIG. 16 embodiment, such depicted processing leaves some of material 60 and 62 within the first and second conductive lines, although all of such material might be removed.

Figure 17:
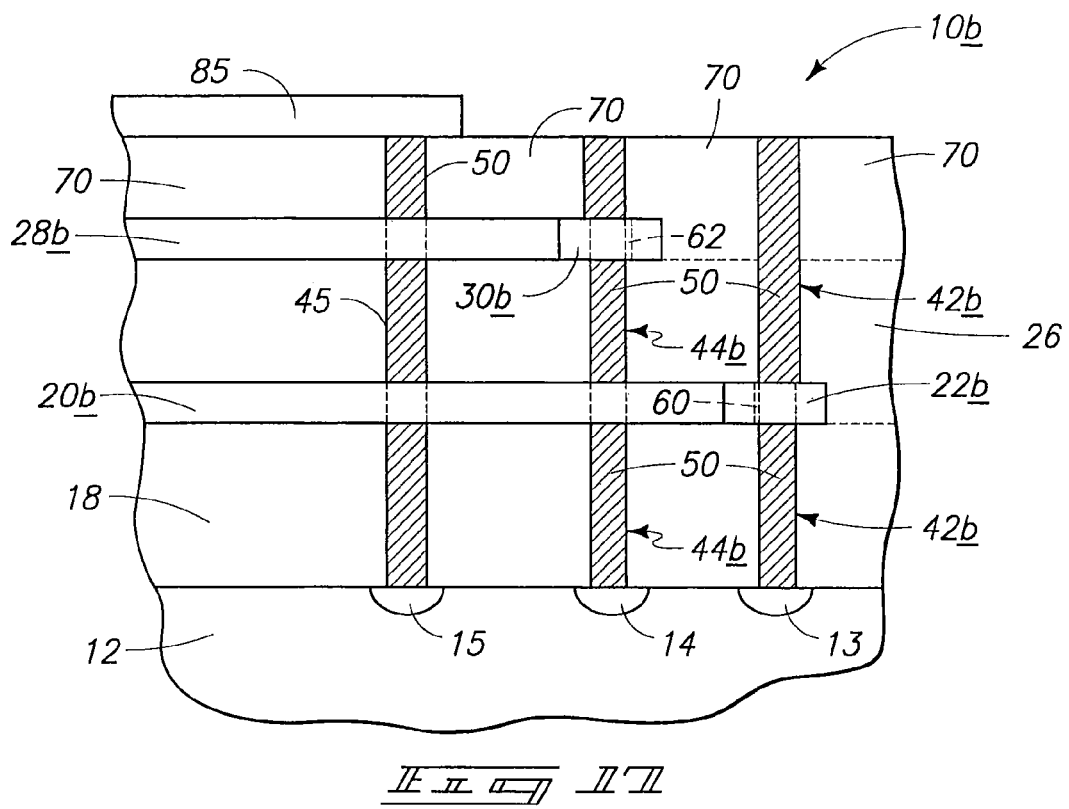
FIG. 17 is a view of the FIG. 16 substrate fragment at a processing point subsequent to that depicted by FIG. 16.

FIG. 17 illustrates conductive material 50 being provided with openings 42*b* and 44, and a conductive line 85 being formed over layer 70.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of fabricating integrated circuitry, comprising:
   forming first and second conductive nodes on a semiconductor substrate;
   forming a first conductive metal line over the first conductive node, the first conductive node and the first conductive metal line having a first interlevel dielectric therebetween, the first conductive metal line having a laterally enlarged portion with first dielectric material extending internally therethrough and over the first conductive node;
   forming a second conductive metal line over the first conductive metal line, the first and second conductive metal lines having a second interlevel dielectric therebetween, the second conductive metal line having a laterally enlarged portion with second dielectric material extending internally therethrough and over the second conductive node;
   forming a third interlevel dielectric material over the second conductive metal line;

in a common masking step, first etching a second contact opening into and through the third interlevel dielectric effective to expose the laterally enlarged portion of the second conductive metal line, into and through the second dielectric material effective to expose internal side portions of the second conductive metal line, into and through the second interlevel dielectric, and into and through the first interlevel dielectric effective to extend the second opening to the second conductive node; and second etching a first contact opening into and through the third and second interlevel dielectrics effective to expose the laterally enlarged portion of the first conductive metal line, into and through the first dielectric material effective to expose internal side portions of the first conductive metal lines, and into and through the first interlevel dielectric effective to extend the first opening to the first conductive node, the first and second etchings leaving some of the first dielectric material extending internally through the first conductive metal line and some of the second dielectric material extending internally through the second conductive metal line; and providing interconnecting conductive material within the extended first and second openings effective to electrically connect the first conductive metal line with the first conductive node and the second conductive metal line with the second conductive node.

2. The method of claim 1 wherein the first and second etchings etch internal side portions of the first and second conductive metal lines.

3. The method of claim 1 wherein the first and second etchings occur during a plurality of etching steps common to etching of the first and second openings.

4. The method of claim 1 wherein the first and second conductive nodes constitute two different nodes.

5. The method of claim 1 wherein the first and second conductive nodes constitute a single, common node.

6. The method of claim 1 wherein the first, second and third interlevel dielectrics, and the first and second dielectric materials, are common in composition.

7. The method of claim 1 wherein conductive portions of each of the first and second conductive metal lines consist essentially of metal.

8. The method of claim 1 wherein all conductive portions of each of the first and second conductive metal lines consist essentially of metal.

9. The method of claim 1 wherein the first and second conductive nodes have outer surfaces received at a common elevation and to which the first and second openings are formed.

10. The method of claim 1 wherein the first and second conductive lines have respective outermost surfaces which are globally planar.

\* \* \* \* \*